United States Patent [19]

Kondow et al.

[11] Patent Number: 5,157,679
[45] Date of Patent: Oct. 20, 1992

[54] OPTOELECTRONIC DEVICES

[75] Inventors: Masahiko Kondow, Kokubunji; Toshihiro Kawano, Ome; Shigekazu Minagawa, Tokyo; Shin Satoh, Iruma; Kenji Uchida, Hachioji; Toshiaki Tanaka, Kokubunji; Takashi Kajimura, Tokyo, all of Japan

[73] Assignee: Hitachi-Ltd., Tokyo, Japan

[21] Appl. No.: 642,006

[22] Filed: Jan. 16, 1991

Related U.S. Application Data

[63] Continuation-in-part of Ser. No. 419,717, Oct. 11, 1989, abandoned.

[30] Foreign Application Priority Data

Jan. 16, 1990 [JP] Japan .................................. 2-004607

[51] Int. Cl.$^5$ ................................................. H01S 3/19
[52] U.S. Cl. ....................................... 372/46; 372/45; 372/47
[58] Field of Search ............................. 372/45, 46, 47

[56] References Cited

U.S. PATENT DOCUMENTS 4,974,231 11/1990 Gomyo ................................. 372/46
5,016,252 5/1991 Hamada et al. ..................... 372/45

OTHER PUBLICATIONS

Minagawa et al., "Room Temp. CW Operation of Short Wavelength GaInP/AlGuInP Laser Grown on (511) A GaAs Substrate by MVPE," Electronics Letters, Jul. 6, 1989, vol. 25, No. 14, pp. 925–926.

Andre, et al., "Extended Abstracts of the 20th Conference on Solid State Devices and Material", 1988 pp. 387–390.

Andre, et al., Journal of Crystal Growth, pp. 354–359, 1986.

Primary Examiner—Georgia Y. Epps
Attorney, Agent, or Firm—Antonelli, Terry, Stout & Kraus

[57] ABSTRACT

An optielectronic device comprising a substrate crystal whose crystal plane is a (n11) plane tilted from the (100) plane toward the [110] direction, or [110] direction where (n>1). When the substrate is applied to an AlGaInP semiconductor laser, the optical device can be cleaved into a rectangular shape, as in the case of a (100) substrate crystal, resulting in easy handling of the chips and also is effective for making the lasting wavelength shorter, lowering the threshold current density for lasing, improving the continuous lasing temperature, etc. Furthermore, semiconductor lasers of different lasing wavelengths can be prepared under good control. Furthermore, a doping efficiency having no dependence on a tilt angle can be obtained by proper selection of a dopant. For example, Si is suitable as an n-type dopant entering sites of group III atom on an (n11) A plane $(n \geq 2)$.

17 Claims, 7 Drawing Sheets

● --- GROUP III ATOM
○ --- GROUP V ATOM

OPTOELECTRONIC DEVICES

CROSS-REFERENCE

This application is a continuation-in-part application of Ser. No. 419717 filed Oct. 11, 1989 now abandoned.

BACKGROUND OF THE INVENTION

This invention relates to optoelectric devices using compound semiconductors.

Also the conventional compound semiconductor devices are usually formed on (100) crystal substrates, and the threshold current density for lasing is lowered when a quantum well laser is made on a (111) plane according to a recent report [IEEE 45th Annual Device Research Conference, paper VB-1 (1987)].

The present inventors found that the band gap of $Ga_{0.5}In_{0.5}P$ serving as an active layer of AlGaInP lasers was grown on a (100) plane, where 1.849 eV was obtained, whereas 1.914 eV was obtained when grown on a (111) plane, and thus the lasing wavelength of semiconductor laser could be made by at least 20 nm shorter (M. Kondow et al., 35th Meeting of Japan Applied Society, Abstract 29p-ZE-S, Mar. 29, 1988, JSAP Catalog Number: AP881105-02).

Then it was reported that when a semiconductor laser using AlGaInP crystal was formed on a (100) plane to utilize the aforementioned property, a lasing wavelength of 670–680 nm was obtained, whereas a shorter lasing wavelength, i.e. 649 nm, was obtained when formed on a (111) B plane (M. Ikeda Electron. Lett., 1988, 24, pp 1094–1095).

In a (111) B wafer used in the aforementioned report, {110} planes, i.e. cleaving planes intersect on the (111) B plane at 60° or 120°. That is, when the wafer is to be made into chips by cleaving, it is cleaved into a triangular or rhombic shape. It is inconvenient in handling, if chips of uniform shape are not obtained. If the chips have sharp edges at the corners, such sharp edges are liable to break. Thus, the workability and yield are not good, and thus the productivity is low.

When AlGaInP is doped with zinc to make a p-type crystal, a higher hole concentration than $5 \times 10^{17} cm^{-3}$ cannot be obtained with a (100) substrate crystal, and further addition of the dopant deteriorates the crystallinity to the contrary. Thus, the hole concentration is not high enough to obtain high-performance, optoelectronic devices. That is, unless a high hole concentration as high as $1 \times 10^{18} cm^{-3}$ is obtained, an electric resistance remains high and the characteristics and reliability of the devices will be unsatisfactory owing to the heat release.

SUMMARY OF THE INVENTION

An object of the present invention is to provide optoelectronic devices with distinguished characteristics not obtainable with optoelectronic devices formed on a (100) substrate crystal and with a cleaving merit equivalent to that of (100) substrate crystal.

The object of the present invention can be attained by using a substrate crystal whose substrate crystal plane approximates to a (n11) plane, where n>1.

The following advantages will result from use of the (n11) substrate with n>1.

For example, a (111) substrate has 6 cleaving planes which intersect the (111) plane at a right angle, as shown in FIG. 1 (a). Thus, when a wafer of (111) substrate is to be cleaved into chips, chips with various shapes as shown in FIG. 1 (b) to FIG. (d) are obtained, and this causes a serious problem in production. In case of the (511) A substrate, for example, where n=5 in the (n11) substrate, the substrate plane is made by tilting the (100) plane towards the (111) plane by 15.8°. The cleaving planes which intersect the substrate crystal plane at a right angle are (011) and (0$\overline{1}$1) planes, as shown in FIG. 2, and there are no other cleaving planes that intersect the substrate crystal plane at a right angle. Thus, a pair of these crystal planes are easily cleaved, and other planes are less liable to cleave. That is, a Fabry-Perot reflector planes of laser devices can be readily formed with this pair of crystal planes, and chips of rectangular shape can be cleaved from the remaining cleaving planes.

When a semiconductor laser composed of AlGaAs crystal is formed on the (511) A plane, a similar low threshold current density for lasing to that obtainable on the (111) B plane as disclosed in the afore-mentioned literature can be obtained, and much better characteristics can be obtained than those formed on the (100) plane.

When the (n11) substrate is used for a short wavelength semiconductor laser using a AlGaInP crystal on the other hand, the following further advantages can be realized.

One advantage is that GaInP as an active layer can have a broader band gap than that made on the (100) plane. GaInP lattice-matches to GaAs substrate crystal at the composition of $Ga_{0.5}In_{0.5}P$.

When the composition is set to the lattice-matching condition and when the substrate crystal plane is gradually tilted from (100), the band gap is gradually broadened and reaches a saturation at a tilt angle of about 10 degrees, as shown in FIG. 3. Thus, the lasing wavelength of laser can be controlled by properly selecting the tilt angle and can be made maximum with a tilted substrate at a tilt angle of 10 degree or more. The tilt angle of 10 degrees approximately corresponds to n=8 in (n11). As in apparent from FIG. 3, the band gap is completely saturated at n=5, that is, with a (511) substrate. That is, it is apparent from the foregoing data that the shortest lasing wavelength is attainable at n>5. The substrate plane approaches to the (100) plane with increasing n, and the (011) and (0$\overline{1}$1) cleaving planes become approximately perpendicular. Thus, cleaving is easier for those planes than (111) plane where n=1 and the handling of chips becomes easy.

Other advantage is that the hole concentration of $p-(Al_{0.6}Ga_{0.4})_{0.5}In_{0.5}P$ layer to be used as the laser cladding layers in a laser can be made higher. As shown in FIG. 4, the hole concentration of the crystal increases with increasing concentration of zinc as a dopant in the feed gas and saturates at about $5 \times 10^{17} cm^{-3}$ in case of the usually used (100) substrate. It is possible to make a practically usable laser even at such a hole concentration, but that a hole concentration around $1 \times 10^{18} cm^{-13}$ is desirable in order to attain a higher operating temperature and increase reliability. This can be realized with a tilted substrate. FIG. 4 shows an example of using a (511) A substrate, where a value of zinc concentration in the feed gas, divided by the total concentration of Group III elements (Al, Ga and In) is given on the abscissa. As is apparent from FIG. 4, a hole concentration in the order of $10^{18} cm^{-3}$ is obtained As already described, the (511) plane is tilted at an angle of 15.8 degrees from the (100) plane. When a tilted substrate having a smaller tilt angle than 15.8 degrees is used, its hole concentrations fall between the values on the (511) A curve and those on the (100) curve.

Further advantage is that the density of hillocks can be reduced when the tilted substrate is used. Double hetero wafer for lasers grown on the (100) substrate usually has 50 to 100 hillocks/mm$^2$, whereas the density of hillocks can be reduced to less than 30 on a tilted substrate. Thus, the yield of laser devices can be increased.

BRIEF DESCRIPTION OF THE DRAWINGS

FIGS. 13 (a) and 13 (b) show models of configurations of group III atoms and Group V atoms at a (n11) A substrate when Si and Se are used as dopants, respectively.

The present invention will be described in detail below, referring to Examples.

EXAMPLE 1

Figure 5:
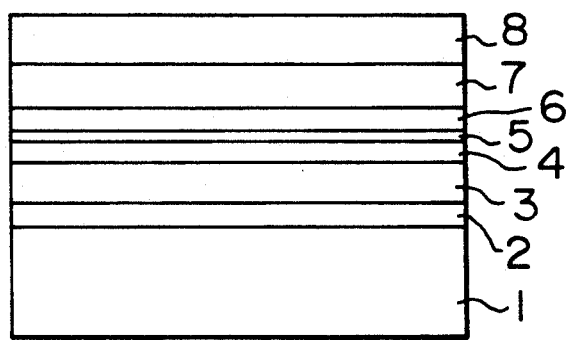
FIG. 5 shows the cross-sectional structure of the GRIN-SCH AlGaAs laser, described in Example 1.

An AlGaAs GRIN-SCH laser (graded index-separate confinement laser) of such a structure as shown in FIG. 5 was formed on the (511) A plane of GaAs by molecular beam epitaxy. That is, the laser was formed by successive growth of a Si-doped, 0.2 μm-thick n-GaAs layer 2 (n=3×10$^{17}$ cm$^{-3}$) as a buffer layer on a Si-doped, n-GaAs substrate cyrstal 1, a Si-doped, 1 μm-thick n-Al$_{0.8}$Ga$_{0.2}$As layer 3 (n=1×10$^{17}$ cm$^{-3}$) thereon, a non-doped, 700Å-thick Al$_x$Ga$_{1-x}$As layer 4 thereon, where x is parabolically changed in the thickness direction from 0.8 to 0.3, a non-doped, 100Å-thick GaAs layer 5 thereon, a non-doped, 700Å-thick Al Ga$_{1-x}$As layer 6 thereon, where x is changed from 0.3 to 0.8, a Be-doped, 1 μm-thick p-Al$_{0.8}$Ga$_{0.2}$As layer 7 (p=1×10$^{18}$ cm$^{-3}$) thereon and lastly a 2 μm-thick p-GaAs layer 8 (p=5×10$^{18}$ cm$^{-3}$) thereon. Ohmic electrodes were formed on the upper side and the lower side of the wafer (not shown in the drawing) and the wafer was cleaved into broad area laser chips with a 400 μm-long, 300 μm-wide cavity.

The threshold current density for lasing of the laser was found to have such a very low value as 1.4 kA/cm$^2$. When the same laser as above was formed on the (100) substrate, the threshold current density was found to be 1.7 kA/cm$^2$. With a substrate crystal whose (511) A substrate was further tilted by 2° to the (111) B plane direction, a laser with the characteristics equivalent to those with exact (511) A substrate was obtained.

EXAMPLE 2

Figure 6:
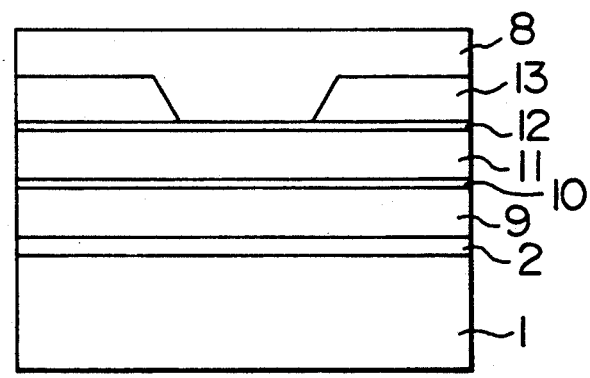
FIG. 6 shows the cross-sectional structure of the gain-guided AlGaInP laser, described in Examples 2 and 3.

A gain-guided AlGaInP laser structure was grown on a substrate crystal whose surface plane was tilted by 10° from (100) toward (111) plane by organometallic vapor phase epitaxy (OMVPE), as shown in FIG. 6. At first, a Se-doped, 0.2 μm-thick n-GaAs layer 2 (n=5×10$^{17}$ cm$^{-3}$) was formed on an n-GaAs substrate crystal 1, and then a Se-doped, 1 μm-thick n-AlGaInP layer 9 (n=1×10$^{18}$ cm$^{-3}$), an undoped 700Å-thick GaInP layer 10, a Zn-doped, 0.8 μm-thick p-AlGaInP layer 11 (p=8×10$^{18}$ cm$^{-3}$), a 0.1 μm-thick p-GaInP layer 12 (p=1×10$^{18}$ cm$^{-3}$) and lastly a 1 μm-thick n-GaAs layer 13 (n=1×10$^{18}$ cm$^{-3}$) were successively formed thereon. A 7 μm-wide channel was formed along the [011] direction by photolithography, and by chemical etching in the uppermost n-GaAs layer. Then, a Zn-doped, 2 μm-thick p-GaAs layer 8 (p=1×10$^{19}$ cm$^{-3}$) was grown thereon and ohmic electrodes were evaporated on the top and bottom sides of the wafer. Finally, the wafer was cleaved into laser chips with a 250 μm-long cavity. The lasing wavelength of the thus obtained laser at continuous operation at room temperature was 658 nm. The lasing wavelength of a corresponding laser likewise formed on the (100) substrate crystal was 677 nm. Thus, the wavelength was made short by about 20 nm, which corresponds to an approximately 4-fold increase in terms of visibility.

With this example, the continuous lasing was possible up to 100° C., which is a remarkable improvement, as compared with 80° C. for a corresponding laser formed on the (100) substrate. This was due to the high hole concentration realized for the p-AlGaInP grown on the 10°-tilted substrate.

EXAMPLE 3

Figure 1A:
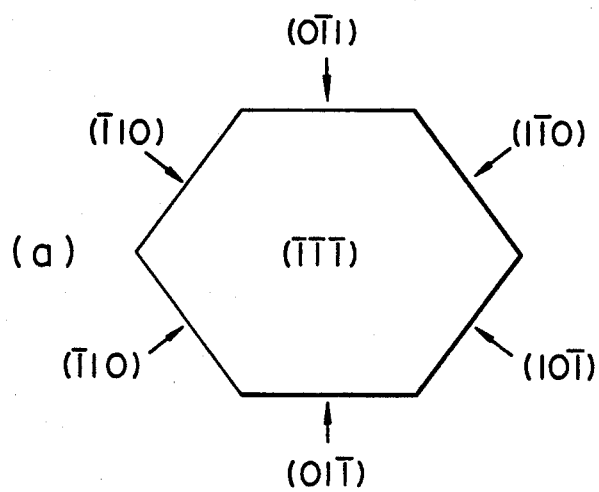
FIGS. 1 (a) to (d) show the cleaving planes of (111) substrate crystal and cleaved chip shapes of a zincblend-type crystal.
Figure 1B:
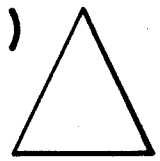
Figure 1C:
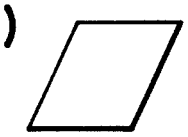
Figure 1D:
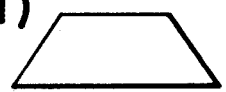
Figure 2:
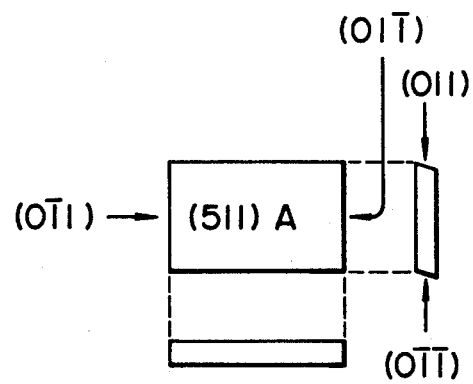
FIG. 2 shows the chip shape when a (n11) substrate crystal is cleaved, referring to (511) A substrate as an example.
Figure 3:
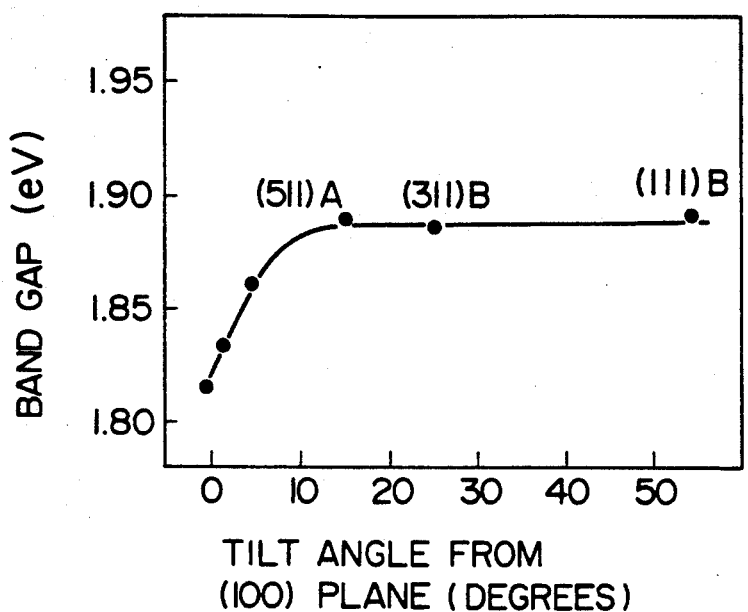
FIG. 3 is a diagram showing changes in the band gap of Ga$_{0.5}$In$_{0.5}$P crystal with a tilt angle from the (100) where tilt angles of 2° and 5° correspond to n=40 and n=16, respectively.
Figure 4:
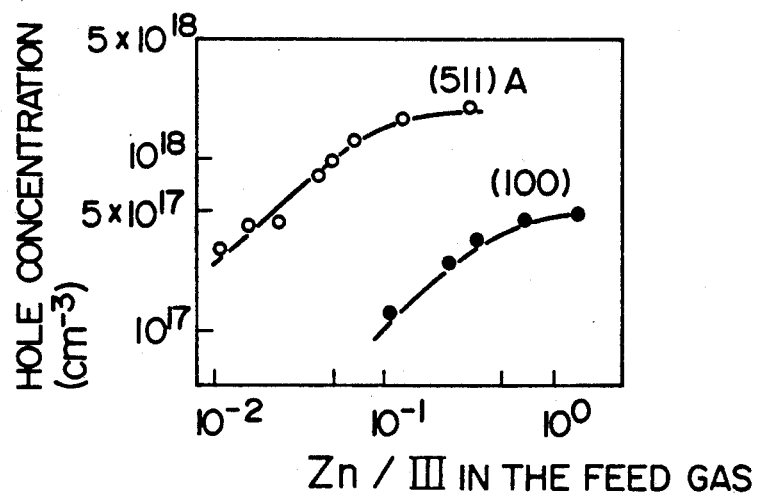
FIG. 4 is a diagram showing the effects of substrate orientation on the hole concentration of zinc-doped (Al$_{0.6}$Ga$_{0.4}$)$_{0.5}$In$_{0.5}$P crystal.

A laser of the same structure, described in Example 2, was formed on a crystal substrate, tilted by 5° from (100) toward the (111) plane. In this case, the lasing wavelength at room temperature CW operation was 665 nm, which is intermediate between the lasing wavelength of a laser formed on the (100) substrate crystal and that of a 10°-tilted substrate crystal. This is in a good agreement with the band gap variation of GaInP crystal with the tilt changes in the tilt angle of the substrate as shown in FIG. 3.

EXAMPLE 4

This example shows an application of the present invention to an index-guided laser.

Figure 7:
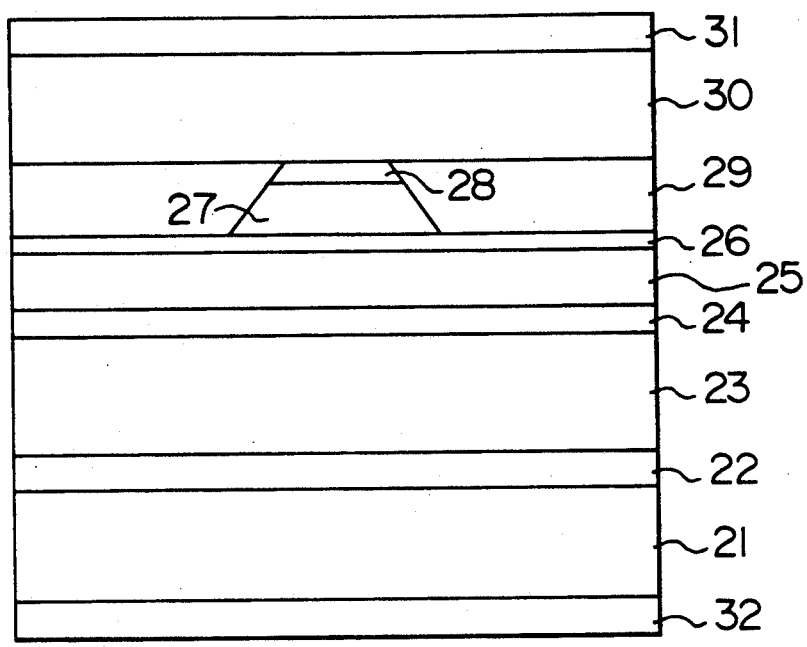
FIGS. 7 to 9 show the cross-sectional structures of the index-guided laser, described in Examples 4 to 6, respectively.

As shown in FIG. 7, a n-GaAs buffer layer 22 (thickness: d=0.5 μm, electron concentration: n$_D$32 1×10$^{18}$ cm$^{-3}$) was formed by organometallic vapor phase epitaxy (OMVPE), on an n-GaAs tilted substrate 21 [substrate tilted by 10° from the (001) plane toward the [110] direction], and an n-(Al$_x$Ga$_{1-x}$)$_{0.51}$In$_{0.49}$P cladding layer 23 (d=0.8-1.0 μm, $n_D32$ 7-9×10$^{17}$ cm$^{-3}$, x=0.6], an undoped $(Al_yGa_{1-y})_{0.51}In_{0.49}P$ active layer 24 (d=0.04-0.06 μm, y=0), a p-$(Al_xGa_{1-x})_{0.51}In_{0.49}P$ cladding layer 25 (d=0.2-0.3 μm, hole concentration: $n_A$=6-9×10$^{17}$ cm$^{-3}$, x=0.6), a p-$Al_zGa_{1-z}As$ (0.35<z) or p-$Ga_{0.51}In_{0.49}P$ thin film layer 26 (d=0.002-0.006 μm, $n_A$=8-9×10$^7$ cm$^{-3}$), a p-$(Al_xGa_{1-x})_{0.51}In_{0.49}P$ cladding layer 27 (d=0.6-0.8 μm, $n_A$=6-9×10$^{-17}$ cm$^{-3}$, x=0.6) and a p-$Ga_{0.51}In_{0.9}P$ layer 28 (d=0.08-0.1 μm, $n_A$=1-2×10$^{18}$ cm$^{-3}$) were successively grown by OMVPE. The epitaxial growth temperature was 680° to 690° C., and the ratio of group V element to group III elements was 140.

Then, a SiO$_2$ insulating film was deposited on the top surface and a stripe pattern of the SiO$_2$ film was formed by photolithography and chemical etching. The stripe pattern stretches along the [110] direction perpendicular to the substrate-tilting [110] direction. By utilizing the SiO$_2$ insulating film mask and chemical etching down to the etching-stop layer 26, a ridge-stripe structure was prepared. As an etchant for the layers 27 and 28, it was preferable to use a mixture of an aqueous hydrogen halide solution, which is reaction rate-limiting type with an echant diffusion-limitting phosphoric acid rather than a single aqueous hydrogen halide solution, because the shape of the cross-section of the stripe was kept almost symmetrical. It was also possible to obtain a completely symmetrical stripe shape by dry etching. After the preparation of the ridge structure, an n=GaAs block layer 29 (d=0.6-0.8 μm, $n_D32$ 2-4×10$^{18}$ cm$^{-3}$) was selectively grown, while leaving the SiO$_2$ insulating film stripe mask as it is. Next, the SiO$_2$ insulating film was removed by etching, and then a p-GaAs layer 30 (d=2-3 μm, $n_A$=5×10$^{18}$-5×10$^{19}$ cm$^{-3}$) was grown by embedding.

Then, a p-electrode 31 and an n-electrode 32 were evaporated on both surfaces, the wafer was cut into a device form by scribing and cleaving.

In this example, the lasing wavelength of the laser was about 650 nm at continuous working at room temperature, which was shorter by about 30 μm than that of the corresponding devices prepared on the ordinary (001) substrate. Furthermore, the cross-sectional shape of stripe structure, which otherwise tends to be symmetrical due to the crystollographic anisotropy introduced by tilting the substrate plane was kept symmetrical and thus no symmetrical distribution in laser beam intensity was observed both in the near-field pattern and also in the far-field pattern.

In this example, a threshold current of 30 to 50 mA and an optical power for catastrophic damage of 40 to 50 mW were obtained by adjusting the stripe width to an optimum range of 3 to 5 μm.

EXAMPLE 5

Figure 8:
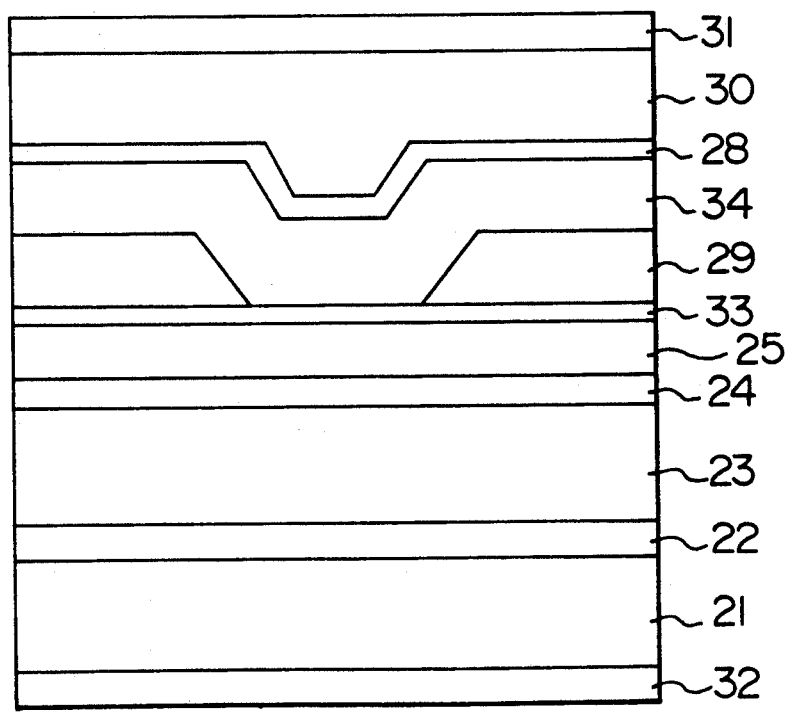

Other embodiment of the present invention will be described below, referring to FIG. 8.

Preparation was carried out in the same manner as in Example 4.

On a tilted n-GaAs substrate 21 [tilted by 10° from the (001) plane to the [110] direction] were formed an n-GaAs buffer layer 22, an n-$(Al_xGa_{1-x})_{0.51}In_{0.49}P$ cladding layer 23 (x=0.6), an undoped $(Al_yGa_{1-y})_{0.51}In_{0.49}P$ active layer 24 (y=0) and a p$(Al_xGa_{1-x})_{0.51}In_{0.49}P$ cladding layer 25 (x=0.6) by successive growth, and then, a p-$Ga_{0.51}In_{0.49}P$ thin film layer 33 (d=0.002-0.006 μm, $n_A$=8-9×10$^{17}$ cm$^{-3}$) and an n-GaAs block layer 29 (d=0.6-0.8 μm, $n_D32$ 2-4×10$^{18}$ cm$^{-3}$) were grown epitaxially by OMVPE or by molecular beam epitaxy (MBE). Then, a resist or a SiO$_2$ insulating film mask was formed thereon and chemical etching was carried out down to the layer 33 to form a channeled stripe structure. The stripe stretched along [110] direction perpendicular to the substrate-tilting [110] direction.

As an etchant for the layer 29, it was desirable to use a diffusion-limiting phosphoric acid-based solution rather than the reaction rate-limiting sulfuric acid-based solution, because the cross-sectional stripe of the channel can be kept almost symmetrical. It was also possible to obtain a completely symmetrical channel shape by dry etching. After completing channeled stripe structure and removing the mask, a p-$(Al_xG_{1-x})_{0.51}In_{0.49}P$ cladding layer 34 (d=0.6-0.8 μm, $n_A$=6-9×10$^{17}$ cm$^{-3}$, x=0.6), a p-$Ga_{0.51}In_{0.49}P$ layer 28 (d=0.08-0.1 μm, $n_A$=1-2×10$^{18}$ cm$^{-3}$) and a p-GaAs layer 30 (d=2-3 μm, $n_A$=5×10$^{18}$-5×10$^{19}$ cm$^{-3}$) were grown. A p-electrode 31 and an n-electrode 32 were evaporated successively and the wafer was cut into a device form by scribing and cleaving.

The same effects as described in Example 4 were observed also in this example.

EXAMPLE 6

Figure 9:
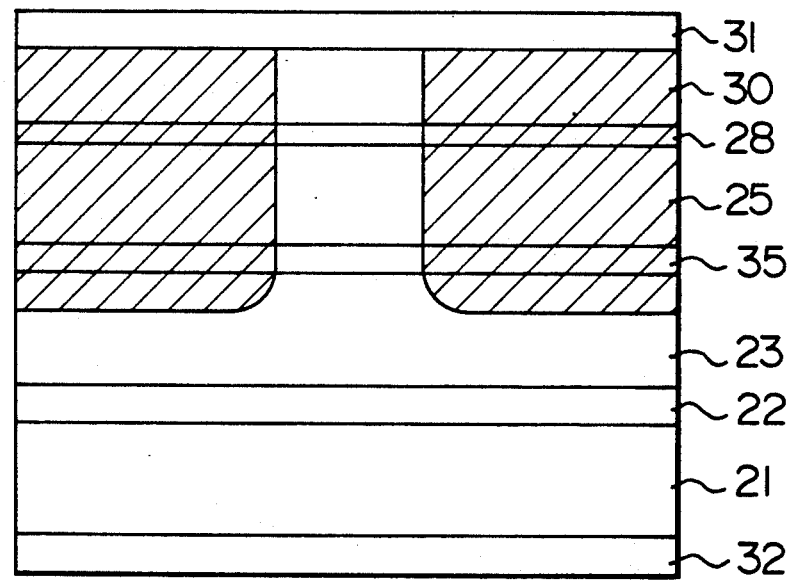

Further embodiment of the present invention will be described below, referring to FIG. 9.

Preparation was carried out in the same manner as in Examples 4 and 5.

On a tilted n-GaAs substrate 21 [tilted by 10° from the (001) plane toward the [110] direction] were formed an n-GaAs buffer layer 22 and an n-$(Al_xGa_{1-x})_{0.51}In_{0.49}P$ cladding layer 23 (x=0.6) by successive growth, and then an active layer 35 of undoped single quantum well structure [consisting of, for example, a quantum well layer of $Ga_{0.51}In_{0.49}P$ (d=0.01-0.02 μm) and upper and lower optical guide layers of $Al_αGa_{1-α})_{0.51}·In_{0.49}P$ (d=0.05-0.2 μm, α=0.3)] or of multiquntum well structure [consisting of 4 repetitions of a set of a quantum well layer of $Ga_{0.51}In_{0.49}P$ (d=0.005-0.01 μm) and a quantum carrier layer of $(Al_βGa_{1-β})_{0.51}·In_{0.49}P$ (d=0.002-0.005 μm, β=0.3)], a p-$(Al_xGa_{1-x})_{0.51}In_{0.49}P$ cladding layer 25 (d=0.8-1.0 μm, $n_A$=6-9×10$^{17}$ cm$^{-3}$, x=0.6), a p-$Ga_{0.51}In_{0.49}P$ layer 28 (d=0.08-0.1 μm, $n_A$=1-2×10$^{18}$ cm$^{-3}$), and a p-GaAs layer 30 (d=2-3 μm, $n_A$=5×10$^{18}$-5×10$^{19}$ cm$^{-3}$) were successively formed epitaxially by OMPVE or by MBE.

Then, a stripe mask of either SiO$_2$ resist or metal film was formed. The stripe stretched along the [110] direction perpendicular to the substrate-tilting [110] direction. By utilizing the stripe mask in diffusing impurities of, for example, Zn, etc. or implanting ions of, for example, Si, etc. so as to reach the active layer of single or multiquantum well structure, a region shown by hatching was formed at both sides of the stripe part. In this manner, disordered alloy was formed in the hatched area at the both sides of the stripe, where the refractive index was lower than at the stripe part. Thus, an index-guided structure, i.e., the center part of the active layer with a higher refractive index, was embedded in the region with a lower refractive index on both sides. The stripe shape of the index-guided structure was made symmetrical even if a tilted substrate was adopted. Next, the film mask was removed, and a p-electrode 31 and an n-electrode 32 were evaporated. The wafer was finally cut into a device form by scribing and cleaving.

In this example, the lasing wavelength was also made short by adopting a tilted substrate, as in Examples 4 and 5, and much shorter due to the quantum size effect by introducing the quantum well structure in the active layer. The lasing wavelength of the laser was 610–630 nm at the continuous working at room temperature, and could be made by 20–40 nm shorter than that of Example 4 and 5. Furthermore, the stripe structure here can be made symmetrical, regardless of substrate orientation and no symmetrical distribution of laser beam intensity was observed in the near-field pattern or in the far-field pattern. The present device had a threshold current of 20–30 mA, and an optical power for catastrophic damage of 40–50 mV was realized.

The foregoing Examples 4, 5 and 6 show that even for the index-guided AlGaInP laser, where a transverse mode control is easy and a lower threshold current density for lasing is possible, and the lasing wavelength of laser can be made by about 30 nm shorter by utilizing substrate crystal tilted by 5°–15°, from the usually used (001) plane to the [110] direction or [1̄10] direction. Furthermore, a technique for readily preparing a laser whose stripe was made as symmetrically as possible was established in the present invention. This enabled control of the transverse mode and symmetrical beam intensity distribution. That is, an AlGaInP semiconductor laser of transverse mode-controlled, index-guided structure to attain a shorter wavelength could be obtained in the present invention. When the active layer was composed of a $Ga_{0.51}In_{0.49}P$ alloy semiconductor, a lasing wavelength of 650±5 nm, a threshold current of 30–50 mA and an optical power for catastrophic damage of 40–50 mW were obtained at the continuous working at room temperature.

In the foregoing examples, description has been made, referring to AlGaAs and AlGaInP alloy semiconductors, but it is needless to say that the present invention is also applicable to $Ga_xIn_{1-x}As$, $Ga_xIn_{1-x}As_yP_y$ and $Ga_xAs_{1-x}Sb_y$ alloy semiconductors.

The present invention is very effective in lowering the threshold current density for lasing, making the lasing wavelength shorter, making a high hole concentration doping of p-type crystal, thereby lowering the resistance, improving a continuous lasing temperature and lowering a hillock density and also have effects on easy cleavage of wafer into a rectangular shape as in the (100) substrate cyrstal and the resulting easy handling of chips.

Next, results of examination on difference in effects due to difference in kinds of dopants are shown below.

Hitherto, Se has been generally used as an n-type dopant in AlGaInP type visible light semiconductor laser device as shown in Example 2 and in Electronics Letters, 25 (1989), pages 925–926, reported by some of the inventors and the semiconductor device has been made by epitaxially making an n-GaAs buffer layer, an n-AlGaInP clad layer, a non-doped GaInP active layer, and a p-AlGaInP clad layer to grow on an n-GaAs crystal substrate successively in this order. However, when crystal growth is carried out from the n-GaAs buffer layer ($n=1\times10^{18}$ cm$^{-3}$) to the n-AlGaInP clad layer ($n=1\times10^{18}$ cm$^{-3}$) while keeping an equal carrier concentration, the H$_2$Se flow rate must be much reduced in view of the relation between the tilt angle of substrate having an (n11) A plane from the (100) plane in the formation of the GaAs layer and the AlGaInP layer and the flow rate of H$_2$Se as a starting gas for n-type dopant which is required for obtaining a desired carrier concentration ($n=1\times10^{18}$ cm$^{-3}$) and this decrement has a tendency to increase with increasing tilt angle of the (n11) A plane from the (100) plane. However, even when the H$_2$Se flow rate is subjected to precise program control by the latest crystal growth technique, it is difficult to abruptly change the H$_2$Se flow rate in the reaction chamber so much and actually H$_2$Se remains in excess for the n-AlGaInP layer during the transfer of crystal growth from the n-GaAs layer to the n-AlGaInP layer. The excess H$_2$Se lowers crystallinity at the hetero interface between the n-GaAs layer and the n-AlGaInP layer and furthermore deteriorates the crystallinity of crystal layer that is subsequently made to epitaxially grow thereon and ultimately deteriorates characteristics of semiconductor laser device, that is, its life.

As a result of extensive studies made by the inventors, it has been found that the deterioration problem will be serious when the (n11) A plane, tilted toward the [011] direction by 3° or more from the (100) plane, at which a difference in the dependence of H$_2$Se flow rate to the GaAs layer and the AlGaInP layer upon the tilt angle of substrate crystal is pronounced, is used and the characteristics, i.e. life of semiconductor laser device using the (n11) A plane of substrate crystal are inferior to those of the device using the (100) plane. Furthermore, the deterioration problem appears when the n-AlGaInP layer is made to epitaxially grow on the n-GaAs layer, using a substrate with the tilted (n11) A plane, but in general in semiconductor devices formed by epitaxial growth on tilted substrates, there are problems that the crystallinity at the hetero interface is deteriorated due to the dependence of doping efficiency upon tilt angle, resulting in considerable deterioration of semiconductor devices.

The inventors have solved the problems by using a dopant free from the dependence of doping efficiency upon tilt angle. Specifically, when a compound semiconductor device is produced by epitaxial growth of semiconductor thin film on a crystal substrate having a crystal plane vicinal to the (n11) plane (where n is a real number of 2 or more) of cubic crystal structure, a dopant entering the cation site is used as an n-type dopant when the crystal plane of crystal substrate is an A plane tilted toward the [011] direction and a dopant entering the anion site is used as a p-type dopant when the crystal plane of crystal substrate is a B plane tilted toward the [011] direction.

In the case of forming Groups III-V compound semiconductor devices comprising atoms of groups III and V of the periodic table, Group IV atoms (such as Si, Ge, etc.) entering the cation site are used as n-type dopants, when the crystal plane of crystal substrate is an A plane tilted toward the [011] direction, [(n11) A plane)] and Group IV atoms (such as Si, Ge, etc.) entering anion site are used as p-type dopants when the crystal plane of crystal substrate is B plane tilted toward the [011] direction, [(n11) B plane].

Furthermore, in the case of forming Groups II–VI compound semiconductor devices comprising atoms of Groups II and VI of the periodic table, Group III atoms (such as Al, Ga, etc.) entering the cation site are used as n-type dopants when a crystal substrate having an (n11) A plane is used, and Group V atoms (such as P, As, etc.) entering the anion site are used as p-type dopants when a crystal substrate having an (n11) B plane is used.

Crystal substrates having an (n11) plane of cubic crystal structure are preferably those having an (n11) plane tilted from the (100) plane by 3° or more. Moreover, an (n11) A plane where the (n11) plane is tilted toward [011] direction is desirable.

In AlGaInP semiconductor laser devices prepared by epitaxial growth of Groups III-V compound semiconductor thin film comprising atoms of Groups III and V of the periodic table on a GaAs substrate having a crystal plane vicinal to the (n11) plane (where n is a real number of 2 or more) of cubic crystal structure, Si or Ge is used as an n-type dopant, when the crystal plane of GaAs substrate is an (n11) A plane, and Si or Ge is used as a p-type dopant, when the crystal plane of GaAs substrate is an (n11) B plane. Thus, a semiconductor laser device having excellent characteristics such as lasing wavelength of 660 nm or less and life of 1000 hours or more can be obtained.

Figure 11:
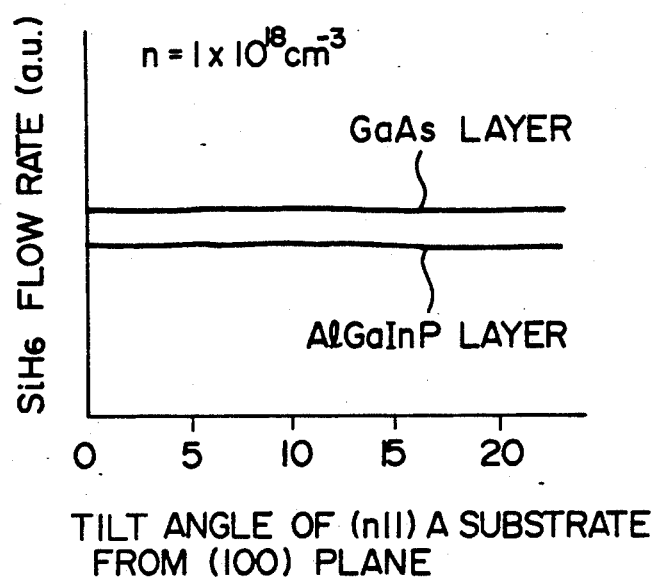
FIG. 11 is a diagram which shows dependence of Si$_2$H$_6$ flow rate for obtaining a carrier concentration of n=1×10$^{18}$ cm$^{-3}$ in GaAs layer and AlGaInP layer on a tilt angle of (n11) A substrate from (100) plane.

FIG. 11 shows relations between the tilt angle (degree) of a substrate having an (n11) A plane from the (100) plane and the flow rate of $Si_2H_6$ which is a gas source for an n-type dopant required for obtaining a carrier concentration of $1 \times 10^{18}$ cm$^{-3}$ when a GaAs layer and an AlGaInP layer are formed. The inventors have found that if Si of Group IV entering the site of Group III of the periodic table is used, there is no significant difference in the doping efficiencies on the GaAs layer and the AlGaInP layer and furthermore there is no influence by a tilt angle from the (100) plane. Thus, it is possible to make addition of a given amount of a dopant without excess or shortage, for example, when crystal growth is transferred from an n-GaAs layer to an n-AlGaInP layer and thus the crystallinity at the hetero interface between the n-GaAs layer and the n-AlGaInP layer can be improved. That is, characteristics of AlGaInP semiconductor laser device using a tilted substrate with an (n11) A plane can be markedly improved with $Si_2H_6$ which is a gas source for Si as an n-type dopant.

FIGS. 13(a) and 13(b) show model configurations of atoms during the crystal growth at an (n11) A plane tilted toward the [011] direction. During the crystal growth, Group III atom planes and Group V atom planes alternately appear on the crystal surface. FIG. 13(a) shows a Group III atom plane and FIG. 13(b) shows Group V atom plane.

An (n11) A plane comprises a plurality of (100) planes joined together stepwise (hereinafter referred to as "micro(100) planes"). In FIG. 13(a), configuration of Group III atoms on the surface and Group V atoms under and adjacent to the group III atoms is uniform on the interface between micro(100) planes themselves (atom step) and on the micro(100) planes. That is, Group III atoms indicated by a and a' in FIG. 13(a) each link to one Group V atom through a double bond. On the other hand, in FIG. 13(b), configuration of Group V atoms on the surface and Group III atoms under and adjacent to the Group V atoms is not uniform in the atom step and on the micro(100) planes. That is, Group V atom in the atom step (atom indicated by b in FIG. 13(b)) links to only one Group III atom through a single bond and this configuration is different from that of Group V atom (atom indicated by b' in FIG. 13(b)) on the micro(100) plane, where the group V atom links to two group III atoms through a single bond, respectively.

Figure 12:
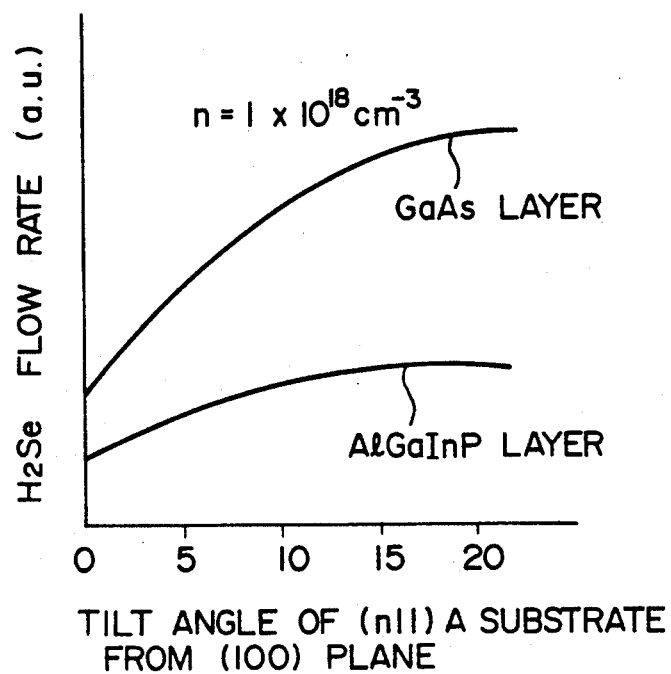
FIG. 12 is a diagram which shows dependence of H$_2$Se flow rate for obtaining a carrier concentration of n=1×10$^{18}$ cm$^{-3}$ in the conventional GaAs layer and AlGaInP layer on a tilt angle of (n11) A substrate from (100) plane.
Figure 12:
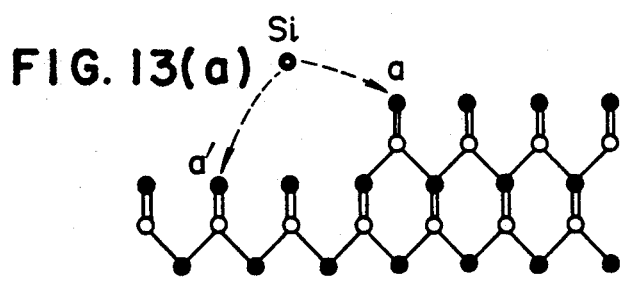
Figure 12:
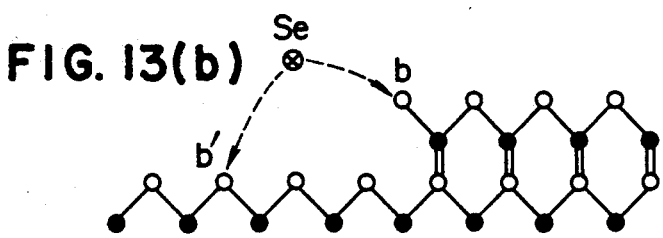

As described above, there is a difference in the configuration of surface atoms, i.e. uniform or not uniform, between the Group III atom plane and the Group V atom plane. This difference seems to show a difference in the doping efficiency depending on a difference in the kind of n-type dopants as shown in FIGS. 11 and 12. That is, when Group IV atoms (such as Si) which enter the site of Group III atom are used as an n-type dopant, the doping efficiency is not influenced by any atom step even if present, while Group VI atoms (such as Se) which enter the site of Group V atom are used as an n-type dopant, the doping efficiency is influenced by an atom step if present and is reduced. Therefore, when Si is used as an n-type dopant, the doping efficiency is not substantially influenced by a density in the atom step, that is, tilt angle from the (100) plane as shown in FIG. 11. Doping efficiency of Zn (Group II atom) which has been hitherto used as a p-type dopant does not depend on a tilt angle of an (n11) A plane from the (100) plane and this can be interpreted according to the abovementioned notion that "Zn is an atom entering the site of Group III atom".

It can be seen from the above that independence of the doping efficiency from a tilt angle from the (100) plane as shown in FIG. 11 is due to selection of an atom entering the site of Group III atom as an n-type dopant so as to have no influence by the atom step on the (n11) A plane, and not due to other factors, for example, special combination of materials such as Si and AlGaInP.

Similarly, since the atom configuration during the crystal growth on an (n11) B plane tilted toward the [011] direction is in such a relation that Group III site and Group V site are interchanged with each other on the (n11) A plane, dependency of the doping efficiency on a tilt angle can be eliminated by using a p-type dopant entering Group V site in place of a p-type dopant entering Group III site.

The (n11) plane which is effective in the present invention is a plane comprising a plurality of micro(100) planes joined together stepwise. The range of n for the (n11) plane which satisfies this condition is n>2.

The following Examples 7 and 8 concern dopants.

EXAMPLE 7

Figure 10:
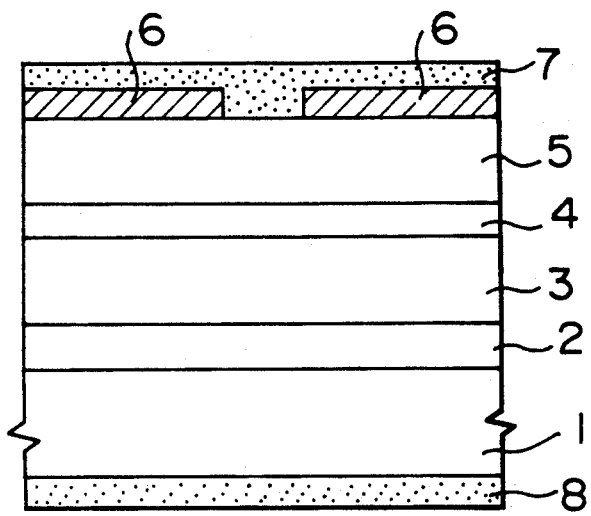
FIG. 10 shows one example of cross-sectional structure of the semicondcutor laser produced in Example 7.

A semiconductor laser having such a structure as shown in FIG. 10 was made by the following procedure.

Si-doped GaAs buffer layer 2 (thickness: 0.2 μm, carrier concentration: $1 \times 10^{18}$ cm$^{-3}$), Si-doped AlGaInP clad layer 3 (thickness: 0.8 μm, carrier concentration: $1 \times 10^{18}$ cm$^{-3}$, non-doped GaInP active layer 4 (thickness: 0.07 μm), and Zn-doped AlGaInP clad layer 5 (thickness: 0.7 μm, carrier concentration: $5 \times 10^{17}$ cm$^{-3}$) were made to epitaxially grow successively in this order on an n-type dopant Si-doped (911) A plane of GaAs substrate 1 (thickness: 300 μm, carrier concentration: $1 \times 10^{18}$ cm$^{-3}$) according to organometallic vapor phase epitaxy. Then, $SiO_2$ current-narrowing film 6 and ohmic electrodes 7 and 8 were provided thereon and then the product was cleaved into $300 \times 300$ μm$^2$ to obtain a semiconductor laser.

The semiconductor laser had a lasing wavelength of 650 nm which was shorter by 30 nm than that of semiconductor laser comprising the same structure as above formed on a (100) plane substrate. This was due to the tilting effect. Furthermore, the threshold current, which had been a problem in the conventional lasers prepared on tilted substrates, was as low as 70 mA which was equivalent to that of a laser having the same structure formed on the (100) plane substrate.

EXAMPLE 8

In this example, an AlGaInP semiconductor laser was formed on the (511) B plane of GaAs substrate.

Epitaxial growth was carried out in a molecular beam epitaxial apparatus under a Group III atom-rich condition so that Ge may enter Group V sites to turn an n-type dopant. Ge-doped GaAs buffer layer (thickness: 0.2 μm, carrier concentration: $1 \times 10^{18}$ cm$^{-3}$), Ge-doped AlGaInP clad layer (thickness: 0.8 μm, carrier concentration: $5 \times 10^{17}$ cm$^{-3}$), non-doped GaInP active layer (thickness: 0.07 μm), and Se-doped AlGaInP clad layer (thickness: 0.7 μm, carrier concentration: $1 \times 10^{18}$ cm$^{-3}$) were made to epitaxially grow successively in this order on Zn-doped (511) B plane of GaAs substrate (thickness: 300 μm, carrier concentration: $1 \times 10^{18}$ cm$^{-3}$) Then, SiO$_2$ current-narrowing film was formed so that stripe may be oriented in the [110] direction, and a Fabry-perot cavity was prepared by dry etching to obtain a semiconductor layser.

The semiconductor laser prepared in this example had also a lasing wavelength of 650 nm, which was shorter by 30 nm than that of laser formed on the (100) plane substrate due to the effect of tilted plane as in Example 7. Threshold current was also as low as 70 mA and thus a semiconductor laser of high performance was obtained.

As explained above in detail, in the compound semiconductor devices of Examples 1, 7 and 8, crystallinity on the hetero interface of semiconductor crystal layers formed on the (n11) plane-tilted substrate by epitaxial growth can be improved by doping. Thus, characteristics of the resulting semiconductor devices can be markedly improved. For example, an AlGaInP semiconductor laser having GaInP as an active layer has distinguished properties such as a lasing wavelength of less than 660 nm and life of more than 1000 hours. Moreover, selection of dopants relates to the crystal growth technique and thus it is needless to say that the selection of dopants can also be applied to semiconductor lasers of other structures as shown in Examples 2-6.

What is claimed is:

1. In an optoelectronic device which comprises a substrate cyrstal having a crystal plane which is substantially a (n11) plane of cubic crystal, where n≧5, a semicondcutor laser formed on the substrate crystal, and the semicondcutor laser having a ridge-shaped or channel-shaped stripe to control a transverse mode and having an active layer and a cladding layer of (Al$_x$Ga$_{1-x}$)$_{0.5}$In$_{0.5}$P, where $0 \leq x \leq 1$.

2. An optoelectronic device according to claim 1, wherein a difference in tilt angle on the side walls of said stripe is controlled to a range of 2° to 10° at the largest.

3. In a compound semiconductor device which comprises a GaAs substrate having a crystal plane which is substantially a (n11) plane (wherein n is a real number of 2 or more) of cubic crystal and an AlGaInP semiconductor laser formed on the substrate by epitaxial growth of a semiconductor thin film comprising elements of Groups III and V of the periodic table, wherein the semiconductor laser is formed with Si or Ge as an n-type dopant when the crystal plane of the GaAs substrate is an A plane tilted toward the [011] direction or with Si or Ge as a p-type dopant when the crystal plane of the GaAs substrate is a B plane tilted toward the [011] direction.

4. A compound semiconductor device according to claim 3, wherein the n-type dopant is Si.

5. A compound semiconductor device according to claim 4, wherein the AlGaInP semiconductor layer has ridge-shaped or channel-shaped stripes which control a transverse mode.

6. An optoelectronic device according to claim 1, wherein said semiconductor laser is an index-guided semiconductor laser, and said crystal plane is inclined in a range of 5° to 15.8° from the (100) plane toward the [011] direction or [011] direction.

7. In a compound semiconductor device which comprises a GaAs crystal substrate crystal and an AlGaInP semiconductor laser formed on the substrate crystal, wherein a crystal plane of the substrate is tilted by 5°-15.8° from a (100) plane toward the [011] or [011] direction and an active layer of the semicondcutor laser has a single or multiquantum well structure.

8. In a compound semiconductor device which comprises a crystal substrate having a crystal plane which is substantially a (n11) plane (wherein n is a real number of 2 or more) of cubic crystal and a compound semiconductor thin film formed on the substrate by epitaxial growth, wherein the compound semiconductor thin film is formed with a dopant which enters cation sites as an n-type dopant when the crystal plane of the crystal substrate is an A plane tilted toward the [011] direction or with a dopant which enters anion sites as a p-type dopant when the crystal plane of the crystal substrate is a B plane tilted toward the [011] direction.

9. A compound semiconductor device according to claim 8, wherein the semiconductor device is a Groups III–V compound semiconductor device comprising elements of Groups III and V of the periodic table and the device is formed with an atom of Group IV which enters cation sites as an n-type dopant when the crystal plane of the crystal substrate is an A plane tilted toward the [011] direction or with an atom of Group IV which enters anion sites as a p-type dopant when the crystal plane of the crystal substrate is a B plane tilted toward the [011] direction.

10. A compound semiconductor device according to claim 9, wherein the atom of Group IV of the periodic table used as n-type dopant or p-type dopant is Si or Ge.

11. A compound semiconductor device according to claim 8, wherein the semiconductor device is a Groups II–VI compound semiconductor device comprising elements of Groups II and VI of the periodic table and the device is formed with an atom of group III which enters cation sites as an n-type dopant when the crystal plane of the crystal substrate is an A plane tilted toward the [011] direction or with, an atom of group V which enters anion sites as a p-type dopant when the crystal plane of the crystal substrate is a B plane tilted toward the [011] direction.

12. A compound semiconductor device according to claim 11, wherein the atom of group III of the periodic table used as n-type dopant is Al or Ga and the atom of Group V used as p-type dopant is P or As.

13. A compound semiconductor device according to claim 8, wherein the crystal substrate having an (n11) crystal plane of cubic crystal is tilted by at least 3° from the (100) plane.

14. A compound semiconductor device according to claim 9, wherein the crystal substrate having an (n11) crystal plane of cubic crystal is tilted by at least 3° from the (100) plane.

15. A compound semiconductor device according to claim 10, wherein the crystal substrate having an (n11) crystal plane of cubic crystal is tilted by at least 3° from the (100) plane.

16. A compound semiconductor device according to claim 11, wherein the crystal substrate having an (n11) crystal plane of cubic crystal is tilted by at least 3° from the (100) plane.

17. A compound semiconductor device according to claim 12, wherein the crystal substrate having an (n11) crystal plane of cubic crystal is tilted by at least 3° from the (100) plane.

* * * * *

UNITED STATES PATENT AND TRADEMARK OFFICE
CERTIFICATE OF CORRECTION

PATENT NO. : 5,157,679

DATED : Oct. 20, 1992

INVENTOR(S) : Kondow et al.

It is certified that error appears in the above-identified patent and that said Letters Patent is hereby corrected as shown below:

On the cover page of the above-identified U.S. Patent, left-hand column, lines 3 and 4 of the section entitled "[75] Inventors:", delete "Shin Satoh, Iruma; Kenji Uchida, Hachioji;"

Signed and Sealed this

Thirtieth Day of May, 1995

Attest:

BRUCE LEHMAN

Attesting Officer

Commissioner of Patents and Trademarks